(12) United States Patent
Mathur

(10) Patent No.: US 6,563,250 B2
(45) Date of Patent: May 13, 2003

(54) PIEZOELECTRIC DAMPING SYSTEM FOR REDUCING NOISE TRANSMISSION THROUGH STRUCTURES

(75) Inventor: Gopal Prasad Mathur, Mission Viejo, CA (US)

(73) Assignee: The Boeing Co., Chicago, IL (US)

( * ) Notice: Subject to any disclaimer, the term of this patent is extended or adjusted under 35 U.S.C. 154(b) by 0 days.

(21) Appl. No.: 09/948,867

(22) Filed: Sep. 7, 2001

(65) Prior Publication Data

US 2003/0048039 A1 Mar. 13, 2003

(51) Int. Cl.[7] .............................................. H01L 41/08
(52) U.S. Cl. .................. 310/316.01; 310/321; 310/326
(58) Field of Search ....................... 316/316.01, 316.02, 316/317, 319, 325, 321, 328, 51; 318/116–118

(56) References Cited

U.S. PATENT DOCUMENTS

| | | | |
|---|---|---|---|
| 4,626,730 A | * 12/1986 | Hubbard, Jr. | ................ 310/326 |
| 4,849,668 A | * 7/1989 | Crawley et al. | ............ 310/328 |
| 4,940,914 A | * 7/1990 | Mizuno et al. | ............. 310/326 |
| 5,126,641 A | 6/1992 | Putman et al. | |
| 5,378,974 A | * 1/1995 | Griffin | ......................... 318/649 |
| 5,558,477 A | 9/1996 | Browning et al. | |
| 5,668,744 A | 9/1997 | Varadan et al. | |
| 5,714,831 A | 2/1998 | Walker et al. | |
| 5,783,898 A | 7/1998 | Wu | |
| 5,802,184 A | 9/1998 | Heath | |
| 5,838,092 A | 11/1998 | Wang et al. | |
| 6,018,210 A | * 1/2000 | Date et al. | ................... 310/311 |
| 6,191,519 B1 | * 2/2001 | Nye et al. | ............... 310/316.01 |
| 6,252,334 B1 | * 6/2001 | Nye et al. | .................... 310/328 |

* cited by examiner

*Primary Examiner*—Mark O. Budd
(74) *Attorney, Agent, or Firm*—Harness Dickey & Pierce P.L.C.

(57) ABSTRACT

A passive piezoelectric damping system dissipates mechanical energy propagating through a structure by tuning a shunt inductance to a non-resonant mode of the structure. The damping system includes a piezoelectric element coupled to the structure, where the piezoelectric element converts the mechanical energy into electrical energy. The electrical energy has a reactive component. The damping system further includes a shunt circuit connected to the piezoelectric element for balancing the reactive component of the electrical energy with a shunt inductance. The shunt inductance is tuned to a non-resonant mode of the structure to reduce airborne noise transmission through the structure.

16 Claims, 2 Drawing Sheets

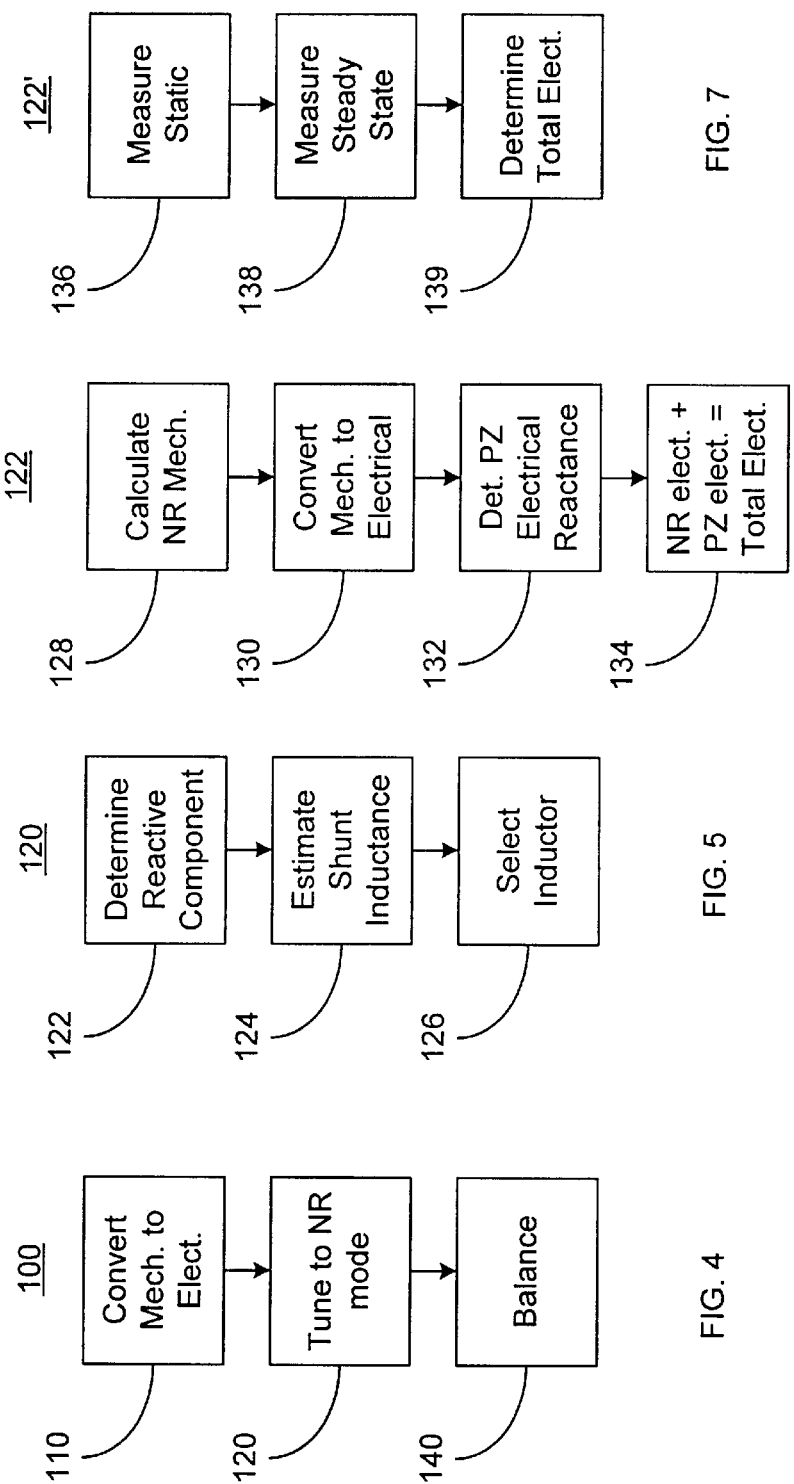

PIEZOELECTRIC DAMPING SYSTEM FOR REDUCING NOISE TRANSMISSION THROUGH STRUCTURES

BACKGROUND OF THE INVENTION

1. Technical Field

The present invention relates generally to piezoelectric damping systems. More particularly, the invention relates to a passive piezoelectric damping system having a shunt inductance tuned to a non-resonant mode of a structure.

2. Background Art

Interior noise control is of vital importance in aircraft, rotorcraft, launch vehicles, automobiles and many other engineering applications. The noise levels in commercial and military aircraft and helicopters can be very high and can result in passenger discomfort, interference with communications, and crew fatigue. A variety of noise sources and transmission paths contribute to cabin noise. Sources such as propellers, rotors, inlet and exhaust systems, machinery and engines generate noise that impinges directly on the exterior of the fuselage and transmits into the cabin. Such noise is referred to as "airborne noise". Control of the interior noise environment requires significant effort, and the noise control measures usually result in substantial added weight and reduced performance.

Passive noise control treatments, such as lead vinyl sheets, have been used to attenuate low frequency airborne noise transmission. Higher frequency airborne noise is usually controlled by acoustically absorptive treatments, e.g., fiberglass blankets. These methods, however, add considerable weight to the aircraft, thereby affecting aircraft performance and operational cost. In order to reduce weight and manufacturing costs, new methods must be developed which are simpler and require minimum maintenance.

Some specific examples where passive piezoelectric elements can be readily used are aircraft and rotorcraft. The cabin noise environment in a rotorcraft is, in general, unbearable and is dominated by intense tones which come from rotors and other sources. Low frequency tonal noise is becoming a problem in new generation aircraft in which engines are mounted directly to the wing. The engines on some aircraft are mounted on a pylon in close proximity to the airframe thereby transmitting even more intense engine tones inside the cabin. Similar severe vibration and noise problems also exist in the space station and launch vehicles. It is therefore desirable to provide new noise control treatments to reduce cabin noise.

Airborne noise transmission in the low to mid-frequency range, in particular, is a very difficult problem to solve as it responds only to large increases in the weight of the structure. FIG. 2 demonstrates a conventional mechanical damping system to better illustrate the difficulties associated with conventional approaches. It can be seen that the mechanical damping system (with a single degree of freedom—SDOF) has a mass $14'$ responding to an input force $F_{in}$, a spring $32'$, and a viscous damper $34'$. An electrical circuit representation of the mechanical damping system is shown in FIG. 3. With continuing reference to FIGS. 2 and 3, it can be easily shown that the response and input mobility (Y=v/F, where v is velocity response and F is input force) of the SDOF system at the resonance frequency is inversely proportional to the damping loss factor. At resonance, the reactance of the mass $14'$ is canceled by the inductance of the spring $32'$ in the mechanical system. The balancing of the mass reactance with the inductance occurs within a very narrow frequency range (called the half-power bandwidth) in the vicinity of the resonance frequency. Consequently, the mechanical mobility of a SDOF mechanical system at resonance can be represented by a pure dashpot $34'$ or as an outside resistor $34$ in the electrical circuit representation. The vibration energy associated with the resonance mode in the mechanical system is, therefore, able to flow and get dissipated in the outside resistor $34$. The path for the mechanical energy to flow from the structure to an electrical circuit is provided by a piezoelectric element, which is bonded to the structure and converts mechanical energy into electrical energy.

The input mechanical mobility of a structure for non-resonant transmission, however, is very different from that described for the resonant transmission. A piezoelectric shunt circuit tuned at a resonance frequency will not provide a matching electro-mechanical circuit for the NR modal energy to flow through. It can be shown that the mechanical mobility of an NR mode, which is spatially excited at a frequency much higher than its natural frequency, is mostly capacitive reactance as opposed to simply resistive reactance for a resonant mode. In fact, the inductance (or stiffness) of the NR mode is almost non-existent at the driving frequency, and does not balance the capacitive reactance of the NR mode. The mechanical energy of an acoustically-fast NR mode is therefore stored in the capacitive reactance and is released only as radiated sound in the ambient medium. Furthermore, the reactance of the piezoelectric element adds to the total capacitive reactance and must be accounted for in any efficient damping system. It is therefore desirable to provide a new approach to reducing airborne noise transmission (resulting in the excitation of NR modes) using passive piezoelectric elements which do not add substantial weight to the structure.

SUMMARY OF THE INVENTION

The above and other objectives are provided by a system and method in accordance with the present invention for dissipating mechanical energy propagating through a structure. The passive piezoelectric damping system of the present invention includes a piezoelectric element coupled to the structure, where the piezoelectric element converts the mechanical energy into electrical energy. The electrical energy has a reactive component. The damping system further includes a shunt circuit connected to the piezoelectric element for balancing the reactive component of the electrical energy with a shunt inductance. The shunt inductance is tuned to a non-resonant mode of the structure. Tuning the shunt inductance to a non-resonant mode of the structure allows dissipation of mechanical energy resulting from airborne noise without significantly increasing the mass of the structure.

Further in accordance with the present invention, a method for dissipating mechanical energy propagating through a structure is provided. The method includes the step of converting the mechanical energy into electrical energy with a piezoelectric element, where the electrical energy has a reactive component. A shunt inductance is tuned to a non-resonant mode of the structure and the reactive component of the electrical energy is balanced with the shunt inductance.

The present invention also provides a method for tuning a shunt inductance to a non-resonant mode of a structure. The method includes the step of determining a reactive component of electrical energy from a piezoelectric element coupled to the structure. The shunt inductance is then estimated based on the reactive component. The method further includes the step of selecting an inductor having the shunt inductance. Further in accordance with the present invention, the reactive component of the electrical energy can be either estimated or measured.

BRIEF DESCRIPTION OF THE DRAWINGS

The various advantages of the present invention will become apparent to one skilled in the art by reading the following specification and subjoined claims and by referencing the following drawings in which:

FIG. 4 is a flowchart of a method for dissipating mechanical energy propagating through a structure in accordance with the present invention;

FIG. 5 is a flowchart of a method for tuning a shunt inductance to a non-resonant mode of a structure in accordance with the present invention;

FIG. 6 is a flowchart of a method for estimating a reactive component of electrical energy obtained from a piezoelectric electric element in accordance with the present invention; and FIG. 7 is a flowchart of a method for measuring a reactive component of electrical energy obtained from a piezoelectric electric element in accordance with the present invention.

DETAILED DESCRIPTION OF THE PREFERRED EMBODIMENTS

Figure 1:
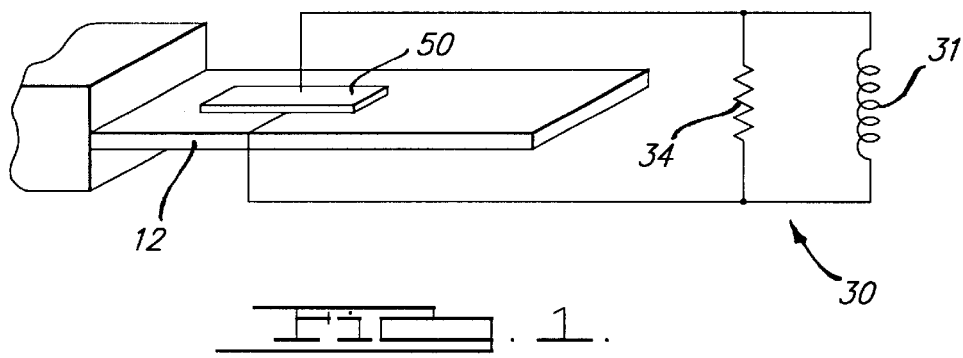
FIG. 1 is an isometric view of a passive piezoelectric damping system in accordance with a preferred embodiment of the present invention.
Figure 2:
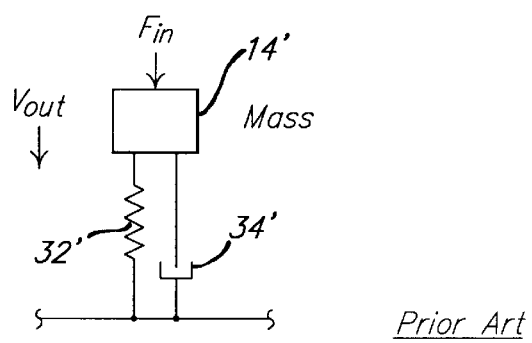
FIG. 2 is a diagram of a conventional mechanical damping system useful in understanding operation of the invention.
Figure 3:
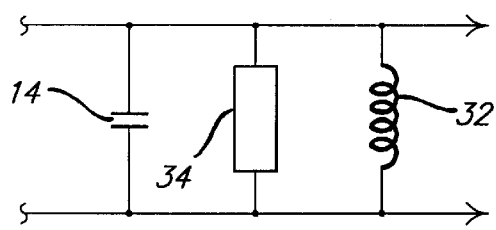
FIG. 3 is a circuit schematic of an electronic model of the conventional mechanical damping system shown in FIG. 2.

In FIG. 1, a passive piezoelectric damping system 10 in accordance with a preferred embodiment of the present invention is shown. The damping system 10 provides a new technique for reducing airborne noise transmission through a structure 12 by dissipating vibration energy in a specially designed shunt circuit 30. Specifically, it can be seen that the damping system 10 has a piezoelectric element 50 coupled to the structure 12, where the piezoelectric element 50 converts the mechanical energy propagating through the structure 12 into electrical energy. As will be discussed in greater detail below, the electrical energy has a strong reactive component. The damping system 10 further includes a shunt circuit 30 connected to the piezoelectric element 50 for balancing the reactive component of the electrical energy with a shunt inductance. The shunt inductance is tuned to a non-resonant (NR) mode of the structure 12. Thus, the shunt circuit 30 includes an inductor 31 having the shunt inductance connected in parallel with the piezoelectric element 50 to cancel the reactive component of the electrical energy. It will be appreciated that the electrical energy further includes a non-reactive component, and that the shunt circuit 30 has a resistor 34 connected in parallel with the inductor 31. The resistor 34 therefore converts the non-reactive component into heat such that the vibration energy is dissipated.

The desirability of tuning the shunt inductance to an NR mode of the structure 12 will now be described in greater detail. Generally, the sound transmission through structures is governed by the well-known mass law, which states that the transmission loss of a structure is determined primarily by its mass per unit area and is largely independent of damping and stiffness. The incident acoustic field excites the lower order modes of the structure 12 along with the resonant modes due to spatial coupling of the lower order modes with the incident acoustic field. When the low frequency, long wavelength modes are excited at frequencies much higher than their resonance frequencies, they become acoustically fast and radiate much better than the resonantly excited modes. The resonant modes carry less of the acoustic energy being transmitted. The most important NR mode is the first (1,1) mode for a structure because the first mode is always excited due to the spatial nature of the excitation field. The first mode of the structure is the first one to become acoustically fast when it is excited at a frequency higher than its own resonant frequency, and when its modal wavenumber equals the acoustic wavenumber at the excitation frequency. After that, odd-odd order modes will sequentially become acoustically fast as their modal wavenumbers equal or exceed the acoustic wavenumber at the excitation frequency.

Thus, the mass controlled, NR modes carry most of the acoustic energy through the structure 12 and give rise to the mass law for describing transmission loss characteristics of a structure. Due to the mass controlled nature of the NR modes, airborne noise transmission only responds to increases in mass of the structure 12 and is not affected by conventional passive damping treatments. The piezoelectric damping system 10 of the present invention proposes a passive method to increase sound transmission loss of structures and is based on dissipating the energy associated with lower order, NR modes. As already discussed, these NR modes carry most of the incident acoustic energy through the structure and the piezoelectric element 50 can be used to convert this energy into electrical energy. The damping system 10 of the present invention therefore does not require a significant increase in the mass of the structure 12 to obtain substantial dissipation of airborne noise.

Turning now to FIG. 4, it can be seen that the present invention provides a method 100 for dissipating mechanical energy propagating through a structure. The method 100 represents a substantial improvement over the above described approach to dissipating energy associated with resonant modes. As already discussed, the mechanical energy is converted into electrical energy with a piezoelectric element at step 110. At step 120, a shunt inductance is tuned to an NR mode of the structure. Furthermore, at step 140 the reactive component of the electrical energy is balanced with the shunt inductance.

FIG. 5 shows that the shunt inductance can be tuned by determining the reactive component of the electrical energy at step 122, and estimating the shunt inductance based on the reactive component at step 124. At step 126, an inductor having the shunt inductance is selected. It will be appreciated that the reactive component of the electrical energy can be determined by either estimation or measurement. FIG. 6 therefore demonstrates the process of estimating the reactive component of the electrical energy. Specifically, it can be seen that at step 128, a non-resonant mechanical reactance is calculated for the structure. This can be achieved by using the expression: $X_{C(N-R)} = 1/j\omega M$, where $M$ is the mass per unit area of an equivalent plate and $\omega$ is the radian frequency in radians per second. Since the unit of capacitive reactance in a mechanical system is different from electrical capacitive reactance, it is important to convert $X_{C(N-R)}$ into an equivalent electrical reactance. Thus, at step 130 the mechanical reactance is converted into an NR electrical reactance. A nomograph for converting a mechanical reactance of a structure into an equivalent electrical reactance can be constructed using experimental procedures discussed below. This results in an effective calibration of the input mobility of a mechanical system in terms of electrical impedance.

At step 132, a piezoelectric electrical reactance for the piezoelectric element can be determined. This value can be easily measured or obtained from the manufacturer. It is important to note that the piezoelectric element is tuned to the offending vibration frequency to maximize energy absorbing characteristics. This allows the piezoelectric element to operate as a passive device as opposed to an active control device. The piezoelectric element may use a variety of piezoelectric sensors, such as lead-zirconate-titanate (abbreviated as PZT) transducers or polyvinyledene fluoride (also known as PVDF) films deposited onto the structure. The combined total reactance of the NR mode and the piezoelectric element is therefore given by the expression: $X_T=X_{C(N-R)}+X_{PZT}$, since these elements are connected in parallel. Thus, at step 134 the NR electrical reactance is added to the piezoelectric electrical reactance. The shunt inductance ($X_L$) required to balance $X_T$ can now be found by the standard equation: $X_T=X_L$, where $X_L=j\omega L$.

Turning now to FIG. 7, it will be appreciated that the reactive component of the electrical energy can also be measured at step 122'. Specifically, step 136 demonstrates that the static impedance of the electrical energy can be measured when the structure is not excited by any external forces. The structure is then excited by an acoustic field in a manner in which an NR mode is excited, and a steady state impedance of the electrical energy is measured at step 138. As already noted, the presence of the first NR mode can be recognized by comparing its modal wavenumber (e.g. $k_{1,1}$) with the acoustic wavenumber ($k_0=\omega/c_0$, where $c_0$ is the speed of sound in the ambient medium). The first NR mode will become acoustically fast when $k_{1,1} \leq k_0$. Using measured electrical impedances of the combined system under static and steady state conditions, an equivalent electrical impedance of the NR mode can be determined at the desired frequencies. Thus, at step 139 the reactive component of the electrical energy is determined based on the static impedance and the steady state impedance.

The present invention represents a significant breakthrough in noise control technology by applying piezoelectric shunt devices to airborne noise transmission. The control of vibration energy associated with NR modes will result in a reduction of airborne noise transmission through a structure before it is radiated into the aircraft cabin. The damping system 10 (FIG. 1) can be used as an add-on device, an integrated component of the design process, or an integrated component of the manufacturing process. The present invention can be used to reduce the noise inside aircraft, helicopters, automobiles, and aerospace vehicles and structures. Other possible applications include appliances and buildings. The method and damping system of the present invention therefore provide a unique opportunity to improve conditions for flight crews, passengers and equipment.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A method for dissipating mechanical energy propagating through a structure, the method comprising the steps of:

converting the mechanical energy into electrical energy with a piezoelectric element, the electrical energy having a reactive component;

tuning a shunt inductance to a non-resonant mode of the structure; and balancing the reactive component of the electrical energy with the shunt inductance.

2. The method of claim 1 further including the steps of:

determining the reactive component of the electrical energy;

estimating the shunt inductance based on the reactive component; and selecting an inductor having the shunt inductance.

3. The method of claim 2 further including the step of estimating the reactive component of the electrical energy.

4. The method of claim 3 further including the steps of:

calculating a non-resonant mechanical reactance for the structure;

converting the mechanical reactance into a non-resonant electrical reactance;

determining a piezoelectric electrical reactance for the piezoelectric element; and adding the non-resonant electrical reactance to the piezoelectric electrical reactance.

5. The method of claim 2 further including the step of measuring the reactive component of the electrical energy.

6. The method of claim 5 further including the steps of:

measuring a static impedance of the electrical energy when the structure is not excited by any external forces;

measuring a steady state impedance of the electrical energy when the non-resonant mode of the structure is excited; and determining the reactive component based on the static impedance and the steady state impedance.

7. The method of claim 1 further including the step of tuning the shunt inductance to a first non-resonant mode of the structure.

8. The method of claim 1 wherein the electrical energy further includes a non-reactive component, the method further including the steps of:

connecting an inductor having the shunt inductance in parallel with the piezoelectric element, the inductor canceling the reactive component of the electrical energy;

connecting a resistor in parallel with the inductor, the resistor converting the non-reactive component into heat.

9. The method of claim 1 further including the step of coupling a lead-zirconate-titanate transducer to the structure.

10. The method of claim 1 further including the step of depositing a polyvinyledene fluoride film onto the structure.

11. A method for tuning a shunt inductance to a non-resonant mode of a structure, the method including the steps of:

determining a reactive component of electrical energy from a piezoelectric element coupled to the structure;

estimating the shunt inductance based on the reactive component; and selecting an inductor having the shunt inductance.

12. The method of claim 11 further including the step of estimating the reactive component of the electrical energy.

13. The method of claim 12 further including the steps of:

calculating a non-resonant mechanical resistance for the structure;

converting the mechanical reactance into a non-resonant electrical reactance;

determining a piezoelectric electrical reactance for the piezoelectric element; and adding the non-resonant electrical reactance to the piezoelectric electrical reactance.

14. The method of claim 13 further including the step of measuring the reactive component of the electrical energy.

15. The method of claim 11 further including the step of measuring the piezoelectric electrical reactance.

16. The method of claim 15 further including the steps of:

measuring a static impedance of the electrical energy when the structure is not excited by any external forces;

measuring a steady state impedance of the electrical energy when the non-resonant mode of the structure is excited; and determining the reactive component based on the static impedance and the steady state impedance.

* * * * *